May 1, 1956 B. A. SCHWARZ 2,744,193

MULTI-BUTTON FAVORITE STATION TUNER

Filed Jan. 29, 1952 3 Sheets-Sheet 1

Inventor
Bertram A. Schwarz

By Willits, Helwig & Baillio
Attorneys

May 1, 1956 B. A. SCHWARZ 2,744,193

MULTI-BUTTON FAVORITE STATION TUNER

Filed Jan. 29, 1952 3 Sheets-Sheet 2

Inventor
Bertram A. Schwarz

By Willits, Helwig & Baillio
Attorneys

MULTI-BUTTON FAVORITE STATION TUNER

Inventor
Bertram A. Schwartz
By Willits, Helwig & Baillio
Attorneys 2,744,193
Patented May 1, 1956

2,744,193

MULTI-BUTTON FAVORITE STATION TUNER

Bertram A. Schwarz, Kokomo, Ind., assignor to General Motors Corporation, Detroit, Mich., a corporation of Delaware Application January 29, 1952, Serial No. 268,859

11 Claims. (Cl. 250—20)

This invention relates to means for automatically indexing movable means to stop at certain designated points. More specifically it relates to automatic tuning means for radio receivers in which it is desired to set the tuning means to receive a desired station.

Historically the earliest radio receiving sets were equpped with separate dials by which each of the adjustably tuned circuits was operated. There are usually three tuned circuits in commercial receivers that have to be tuned to adjust the receiver for a particular station. These are in the antenna circuit, the radio frequency amplifier circuit and the oscillator circuit. In the early days each had to be adjusted separately by its own knob. Then receivers were designed in which all three of these circuits were adjusted from one operating member or tuner control. By moving or tuning this control the receiver could be tuned over the entire band of frequencies for which the receiver was designed.

Following this, so-called push button controlled receivers made their appearance. In these devices a plurality of manually engageable buttons were provided on the front of the receiver and when one was forced inwardly by the operator the tuning means was moved to a desired predetermined point by mechanical means. An example of this type of mechanical push button tuner is shown in a patent of Bertram A. Schwarz et al. #2,494,008. Once the push buttons of such a mechanism were set to a predetermined station, pressure on a particular button would quickly bring the receiver directly in tune with that station regardless of what the previous setting had been. These were called favorite station tuners for they were adjusted to quickly bring in tune one of a plurality of stations to which the operator usually listened.

However in the operation of radio receiving means on automotive vehicles the problem of resetting the mechanical cams actuated by the push buttons arises when the vehicle is driven to a different locality out of the range of the stations already set up. There was placed on the market recently a type of automatic tuning means for radio receiving sets that was referred to as a "signal seeking tuner" or "signal actuated" tuning means. In this type the incoming signal itself actuates a triggering means when a station is brought into tune to stop scanning or driving means for tuning the receiver over the band. This type of tuner is disclosed in a copending application Serial No. 193,148 in the names of Bertram A. Schwarz and Manfred G. Wright, filed October 31, 1950, now Patent No. 2,701,330, dated February 1, 1955. This type of tuner requires no presetting and, as it scans the band of the receiver, will stop if the tuner encounters any signal on the air over a prescribed strength. Thus, as the location in which the receiver is operated changes, or the stations which are on the air change, the tuner will automatically index only to those signals received and requires no presetting or adjusting. In this type of tuner, however, the operator cannot tune directly to a given desired station. It is necessary for him to know the approximate frequency of the station desired and then he must hold down the trigger switch causing the tuner to scan the band until he reaches the general locality on the band before he releases the switch and lets the automatic tuning means take over to index on that station. Sometimes it is necessary to scan almost the complete band before coming to the desired location.

It would therefore be very desirable to provide automatic tuning or indexing means which is capable of indexing on signal reception and also able to index directly to several predetermined stations regardless of the position of the tuner in the band; in other words, to have a combination signal actuated tuner and a favorite station tuner.

It is an object of my invention to provide automatic radio tuning means that can be operated to stop on incoming signal reception and also directly on certain favorite predetermined stations.

It is a further object of my invention to provide automatic tuning means for radio apparatus that will scan the band selecting stations on the air in order and index to each in sequence and which also will index directly to certain preselected stations when desired.

It is a further object of my invention to provide a signal actuated automatic tuning means for radio apparatus which also has easily adjustable means which can be moved to any desired part of the band to index the tuning means directly thereto.

With the above and other objects in view my invention will be best understood from an examination of the following specification and claims and the illustrations of the accompanying drawings, in which:

Figure 1:
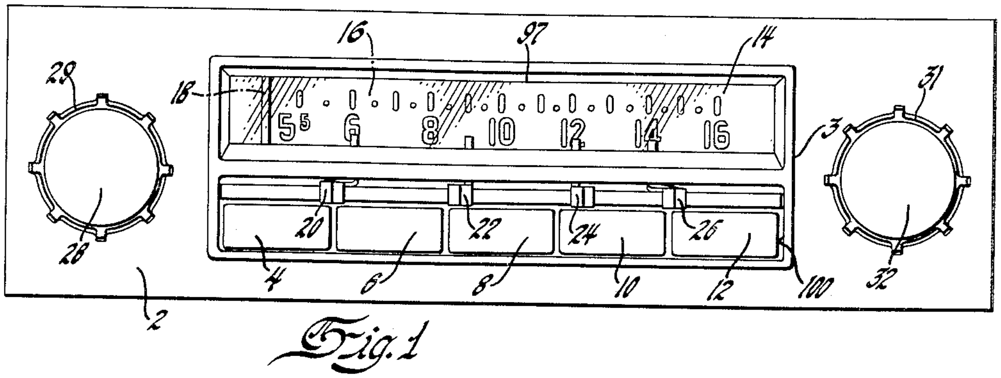
Figure 1 is a front elevation of a radio receiver embodying my invention.
Figure 2:
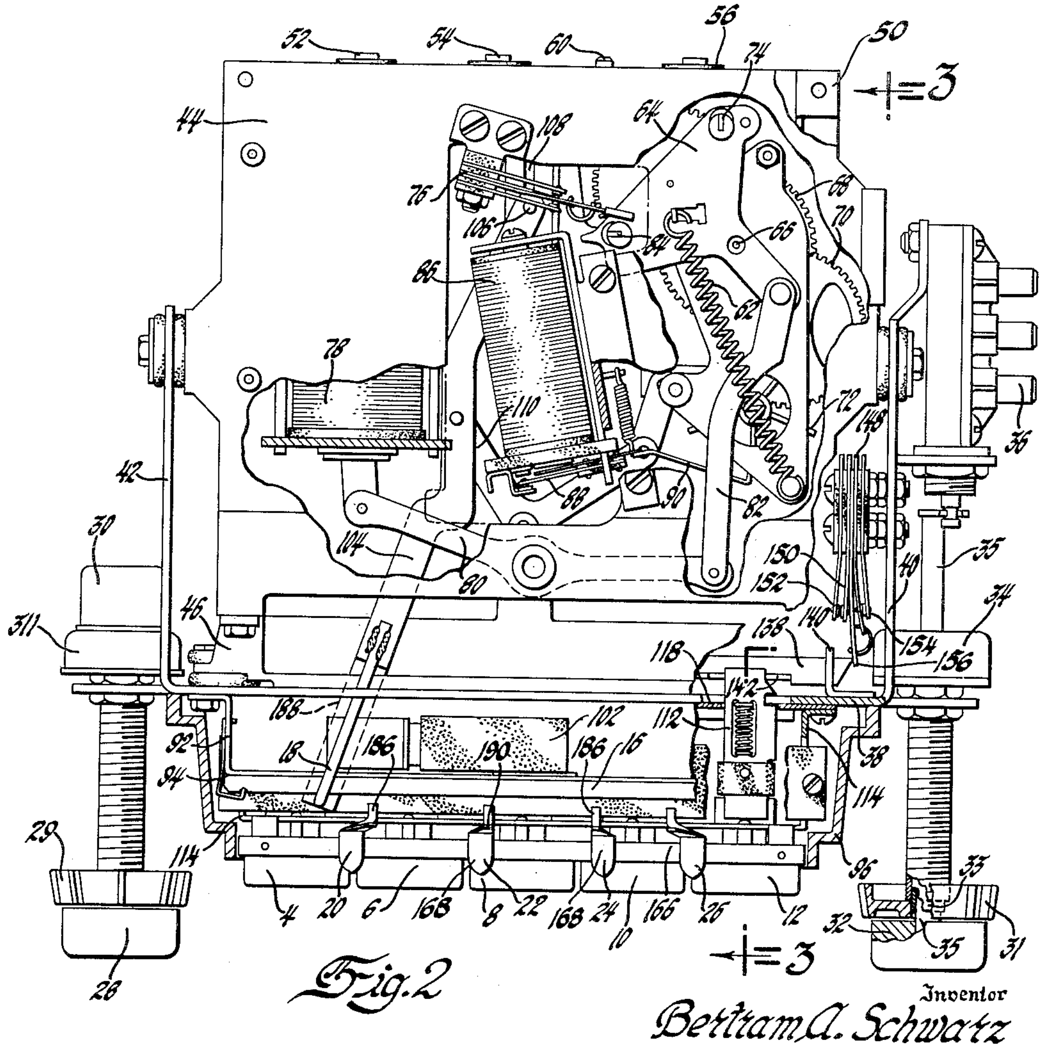
Figure 2 is a top plan view of the radio tuning means with parts broken away and shown in section.

Referring particularly to Figure 1, a radio receiver is shown mounted in a panel 2. An opening 3 in the panel is provided through which the push buttons 4, 6, 8, 10 and 12 project so that they may be actuated by the operator and in part of which a dial glass 14 is mounted through which the dial 16 is visible as well as the indicating needle 18 to show to what portion of the band the tuner is indexed. Also projecting through the opening 100 below the dial and above the push buttons are a plurality of adjustable stops 20, 22, 24 and 26 which are transversely adjustable across the tuner and which will be described more in detail at a later point. The central push button 8 is used to actuate the tuner for stopping on signal and the other four buttons 4, 6, 10 and 12 for bringing the tuner directly to preset stations or favorite stations. The knob 28 on the left of Figure 1 operates an off-on switch and volume control 30. Knob 29 on a concentric shaft operates the signal seeking sensitivity switch 311. The rotatable control knob 31 on the right mounted on sleeve 33 by its rotation actuates a tone control switch 34. The knob 32 mounted on shaft 35 by its axial movement actuates a vacuum valve 36 for moving the antenna of the car up or down as desired.

A frame 38 supports the tuner and includes side frame members 40 and 42 which are integral therewith, the front member being secured to the panel 2 when the set is mounted. The side frame member 40 supports the vacuum valve 36. The main tuner body is mounted in the space between the side frame members at several spaced points. It consists of a housing formed of a plate 44, a front frame 46 connected to the plate, and side members 48 and 50 to form a box type enclosure.

The tuning unit in this instance is illustrated as a variable inductance type or permeability tuned in which the inductance of tuning coils 52, 54 and 56 is varied by comminuted iron cores (not shown) that are inserted or withdrawn from the coils as a unit in straight line motion as a transverse bar 58 moves longitudinally between the side frame guides on rod 60. This type of signal seeking tuner is fully described in the above mentioned copending application Serial No. 193,148, filed October 31, 1950, in the names of Bertram A. Schwarz and Manfred G. Wright.

The scanning movement of the tuning means is provided by the reciprocation of the bar 58 between limits. When the bar is at one end of its travel so that the cores are entirely within the coils, the set is tuned to the low frequency end of the band or approximately 550 kc., but when the bar reaches a position such that the cores are substantially withdrawn from their associated coils, the set will be tuned to the high frequency end of the band or approximately 1600 kc. The tuning and indexing is accomplished during one direction of travel; i. e., the direction just described from fully inserted core position to withdrawn, the return movement being accomplished very quickly.

The motive means for driving the bar 58 is provided by springs 61 and 62 which move a planetary carriage 64 linked to the bar, about its pivot 66. This movement is slowed down or loaded by a gear train 68, 70 which is driven by the movement, said gear train terminating in an air governor 72 which also acts as a part of the stopping or indexing means. When the power of the spring has driven the carriage to its extremity in one direction to tune the receiver, a limit stop 74 throws switch 76, which is a snapover type to energize a cocking solenoid 78. This causes rotation of the carriage 64 in the opposite direction through linkage 80, 82 and a loading of the spring until stop 84 engages switch 76 to throw it back to its original position, deenergizing the solenoid 78. The tuner will then resume its slow scanning action until indexed by a station.

When a signal is received by the set the relay 86, which has been energized during tuning by a circuit which will be described more in detail at a later point, is deenergized, releasing its armature 88 and allowing a detent 90 to fall into the path of the air governor 72 and stop the tuner.

Summarizing, a slow scanning motion is obtained by the spring loaded drive in one direction to scan the band from the low frequency end to the high frequency end during which the detent 90 is kept out of the path of the governor vanes 72 by the energization of the coil 86 unless a station is encountered in which case the coil 86 is deenergized by a circuit to be described, and allows the detent to engage and lock the tuner in this position. There is no indexing on the quick return stroke. This tuning means therefore scans the band in one direction by the outward movement of the multiple core assembly driven by springs 61 and 62 retarded by the gear train and governor 72. When a signal appears in the set the relay 86 is deenergized to drop detent 90 into the governor vanes and stop the tuner.

As the carriage including transverse bar 58 moves on the frame, indicating means are provided so that the operator will have knowledge of the portion of the band in tune. To the front wall of frame 38 there is secured a bracket 92 to the forward face of which is clamped a rectangular dial plate 16, calibrated in the frequencies of the band covered by the receiver, by clamping members 94 at each end. A cover 96 is also secured to the front of the frame 38 extending out over the dial 16 and having a rectangular opening 97 in the top portion in alignment with dial 16 in which opening a covering glass 14 is mounted. A second elongated opening 100 is provided below the first through which various control buttons such as 4, 6, 8, 10 and 12 extend, and may be actuated. An indicating light assembly 102 is mounted on the bracket 92 to show that the receiver is energized.

The indicating needle 18 is mounted to move in front of the dial 16 in substantial straight line motion. This indicating needle is an angled member which is mounted on one end of a lever 104 and arches up over the top of the dial 16. The lever 104 is provided with a slidable pivot at its innermost extremity through a pin 106 which rides in a slot 108 in a member attached to the frame. The lever 104 is pivotally connected to the movable tuning carriage through the bellcrank connection 110. Thus, as the carriage moves back and forth on the frame, the indicating needle will move across the dial 16 to indicate its position.

The device thus far described provides, when connected to the proper circuit, a tuner which will index automatically upon the appearance of an incoming signal from a transmitting station of sufficient strength to actuate the equipment. Once an initiating switch is closed, the tuner will proceed to scan the band, since such closure energizes the relay 86 to move the detent 90 out of the path of the governor, permitting the carriage to move. In the present instance the starting switch for the signal actuated tuning is switch 8 in the center.

It is desired to provide not only control means which will index the tuner on the receipt of an incoming signal but also means which will bring the tuner directly to a given preselected station. In general the function of the additional equipment is to so condition the signal actuated tuning means as to make it incapable of indexing over all but a small portion of the band in the vicinity of the desired station. In other words, the device will disable the signal actuated stopping index means, causing the tuner to scan continuously; but immediately prior to a single desired station it will condition the signal actuated means for operation and it will then stop on this desired station. Broadly, the added apparatus will, upon actuation for a given station, open the circuit for the signal actuated means so that no incoming signal can trip the same but in the vicinity of the desired station complete a circuit so that the signal pulse can trip the indexing means.

In the present showing four so-called favorite station push buttons have been provided, although any desired number may be utilized. These push buttons 4, 6, 10 and 12 are mounted to project through the cover 96 on each side of the signal actuated initiating switch 8. Each of the push button assemblies 4, 6, 10 and 12 is of the same construction and utilizes a flat slide 112 upon the outer end of which the push button such as 12 is mounted. A bracket 114 of the same general configuration as bracket 92 is mounted on the front of frame 38 below 92 and has a series of slots 116 through which the slides extend, said slots acting as guides for the front of the slides. A plate 118 is secured across the base of the bracket 114 having therein aligned slots 120 for supporting and acting as guides for the rear portions of the slides. Each slide has shoulders 122 adjacent the portion that extends through the slot 116 in the bracket 114 to act as a stop and provide only a predetermined amount of motion outwardly. An H-shaped opening is cut in each slide, providing opposing tongues 124. A compression spring 126 is inserted to encompass the tongues and hold a small slidable finger 128 to the rear. When in assembled relation the finger 128 will be pressed against the plate 118 to provide an outward spring bias on each slide.

On the top of each slide there is mounted a contactor assembly consisting of an insulating pad 130 in contact with the upper surface of the slide, a conductive plate 132 on top of the pad 130 and of the same size and a second smaller insulating member 134, the assembly being secured to the slide by riveting means 136 insulated from plate 132. A transversely movable switching and locking bar 138 is mounted parallel to and behind the plate 118. It is loosely supported for such movement in two brackets 140 secured to the frame 38. This bar 138 has a plurality of openings 142 therein in alignment with openings 116 and 120 in the members 114 and 118 respectively. The inner ends of the slides 112 project into these openings. Each slide has a camming portion 144 adjacent the portion that projects into the opening 142 when the slide is in its outermost position. Adjacent the camming section is a locking notch 146. Thus, as the slide is forced inwardly by the operator, it forces the bar 138 to the left as shown in Figure 4, and when the notch 146 is in alignment with the bar the latter slips into the notch to lock the slide in its innermost position.

The bar 138 not only acts as a mechanical locking means for one of the slides or plungers 4, 6, 10 or 12, but it also actuates electrical switching means. Mounted just to the left of the end of bar 138 in Figure 4 on frame member 40 is a spring biased snapover switch identified in general as 148. It consists specifically of multiple central contactor means 150 and 150′ (insulated from each other) that oscillate back and forth between two spaced stationary contacts 152 and 154. A resilient strip spring 156 is carried by the base of the switch and extends out over the central contactor assembly but out of engagement therewith. The spring is so mounted that it bears against the end of the bar 138 to bias it to the right as shown in Figure 4. A bowed snapover-center spring 158 interconnects the spring 156 with the outer end of the central contactor assembly to actuate the same.

Figures 3, 4, 5:
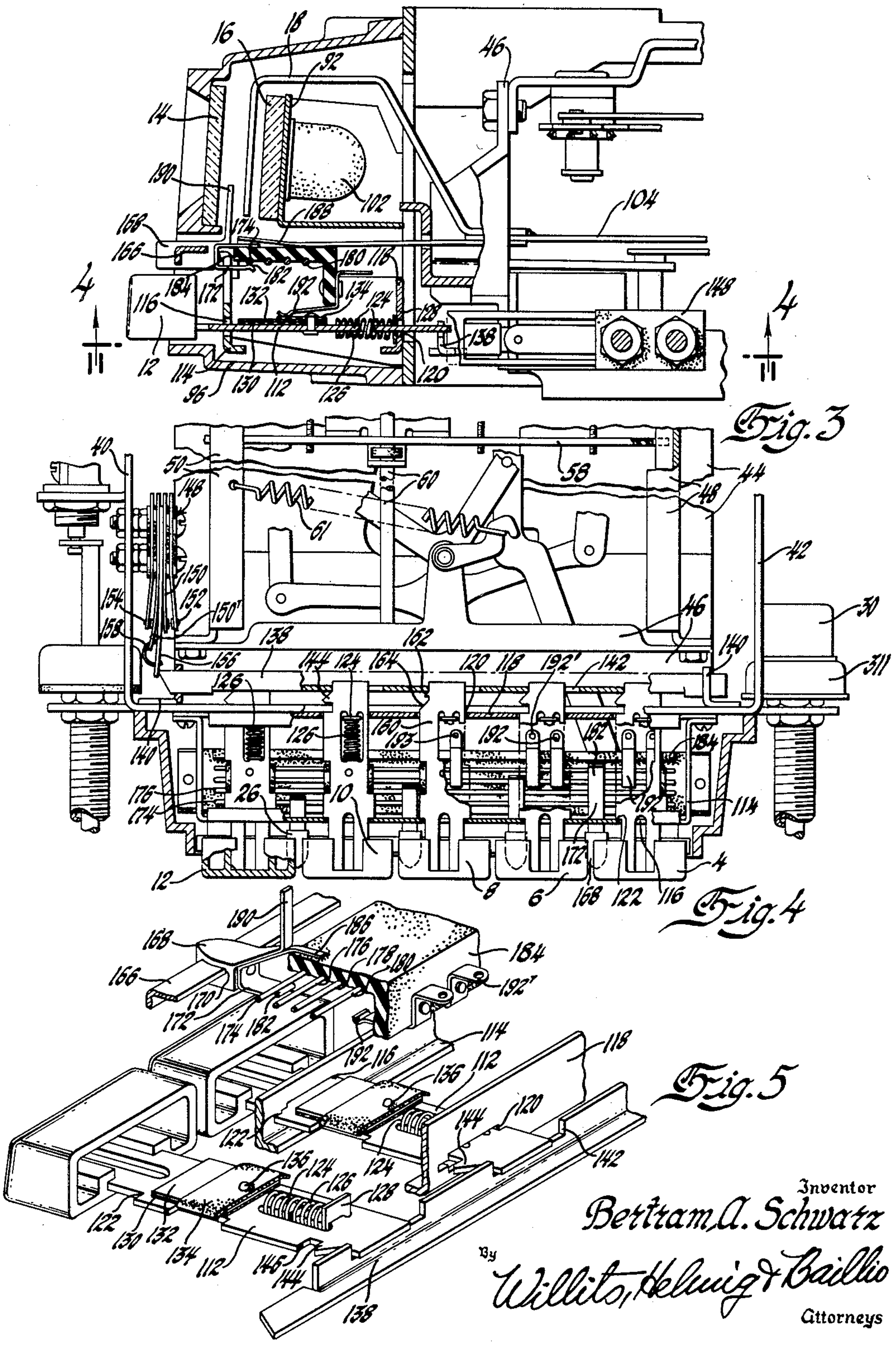
Figure 3 is an enlarged sectional view taken on the line 3—3 of Figure 2.
Figure 4 is a bottom plan view of the tuner taken on the line 4—4 of Figure 3.
Figure 5 is a perspective view showing the push button slides and trolley switching arangement.

When the push buttons are in their forward position the bar 138 is in the position shown in Figure 4 and the spring arm 156 holds it to the right. The central switch contactor is positioned to the left closing contacts 150′—154. When push button 12 for example is pushed inwardly the cam surface 144 on its slide forces the bar 138 to the left. This causes the spring 156 to follow to the left far enough to cause the snapover spring to drive the central contactor to the right momentarily breaking switch 150′—154 and making switch contacts 150—152. However, as soon as the cam surface 144 passes beyond the bar 138 and the notch 146 comes into alignment with the bar, it will return to its original position permitting switch 148 to do likewise.

While the slide assemblies for each of the push buttons 4, 6, 10 and 12 are all the same, that for the central push button 8 differs slightly in the camming and locking portion of the slide. The slide 160 (Figure 4) for the push button 8 has a small locking tooth 162 farther to the rear than the teeth provided on the other slides 112 by the cam section 144 and notch 146. Just ahead of the tooth 162 is a camming surface 164 on this slide. It will be remembered that this push button is provided for plain signal seeking action alone. The small tooth 162 locks this slide in a short distance upon actuation to indicate that the signal seeking operation is in use. Continued inward movement of the slide 160 brings the cam surface 164 into engagement with the bar 138 to slide it transversely, releasing any of the favorite station push buttons which may have been locked in when the slide 160 started its inward movement, and forcing spring 156 to the side to actuate switch 148, breaking contacts 150—154 and making contacts 150′—152 engage until the button is released. The slide moves outward a short distance when released but tooth 162 locks the push button 8 in to some extent but not as far in as the other favorite station push buttons when they are actuated.

One of the features of the present invention is that the selected stations to which the plurality of push buttons may be adjusted may be anywhere in the band of the receiver. The only limitation is that the stations be in the same order across the band as the push buttons that actuate the same. In the present example, in which four push buttons are provided for favorite station selection, there are required an equal number of adjustable setting means, one for each push button assembly. As shown in Figure 1, the adjustable means 20, 22, 24 and 26 provide the desired settings for the push button assemblies 4, 6, 10 and 12 respectively. A transverse rail 166 is mounted from the front of the bracket 114 lying directly over the push buttons and below the cover plate for the dial. The adjustable tabs 20—26 are mounted on this rail and may be moved therealong to any desired setting. Each tab consists of a body 168 through which an opening 170 extends that is of a cross section to fit over the rail 166. To the rear face of the body there is secured a substantially U-shaped conductive member 172. This member forms a trolley for maintaining contact across the band with one of a series of trolley wires 174, 176, 178 and 180, one being provided for each push button. The lower end of each conductive member is bent upwardly as at 182 to provide contact with a desired wire but lie below the remaining wires. The opposite end 186 of each conductive member extends over the top of a rectangular supporting plate 184 of insulating material which carries the wires on its lower face and is itself supported on top of the bracket 114. These narrow conductive strips that overlie the edge of the plate 184 provide the index switching means at the desired points.

This switching is accomplished by engagement between one of the ends 186 and a conductive extension 188 on the indicating lever 18. This portion travels over the top of the insulating plate 184 engaging the ends of the tabs in their adjusted positions as it travels across the band. Each tab has a vertically extending arm 190 which rises in front of the lower portion of the dial and is colored with a contrasting color to the dial. This is to assist the operator in initially setting the tab. Mounted over each of the favorite station slides and carried by the insulating plate 184 are a pair of spaced contact members 192 and 192′ which are spring biased downwardly to engage and ride over the conductive and insulating portions of the slides to connect the operated push button into the control circuit. Over the central slide for button 8 is a similar pair of contacts 193 and 193′. One contact of each pair is connected to a suitable source of power and the other to one of the trolley buses 174, 176, 178 or 180. Thus when the favorite station push button is forced inwardly one of the trolley buses is energized.

Figure 6:
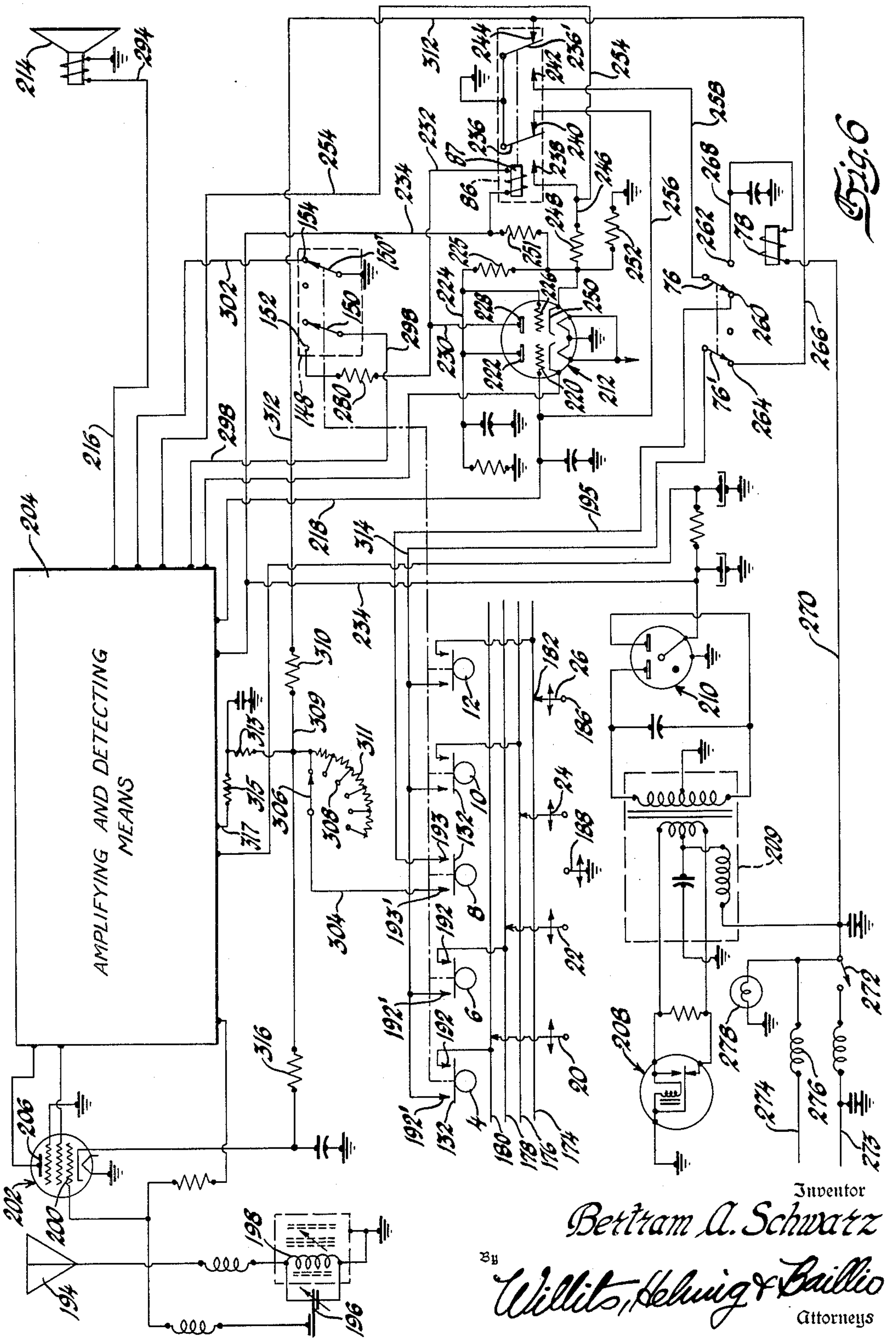
Figure 6 is a circuit diagram of the electrical system for the receiver.

The electrical circuit for my new and novel tuning system is shown in Figure 6 in which the radio receiver circuits per se are of the conventional superheterodyne type which is permeability tuned instead of condenser tuned. The receiving antenna 194 is shown in the upper left hand corner of the figure connected through a tuned circuit consisting of an adjustable condenser 196 and a tuning inductance 198 to the control grid 200 of the radio frequency amplifying tube 202. The remaining parts of the amplifier and detector system are shown by the block 204 labeled "amplifying and detecting means" connected to the plate 206 of the radio frequency amplifier 202.

In general the other main parts of the system consist of a vibrator 208 and transformer 209 which supply a full wave rectifier tube 210 for power supply, a control relay 86 operated by a trigger tube 212, a loud speaker 214, a cocking solenoid 78, and switching means. The control relay coil 86 is shown controlled by the thermionic tube 212. The starting or trigger switch 148 is shown just above the tube 212. The cocking solenoid 78 to provide rapid movement of the tuner in one direction to load the springs is shown below tube 212 and the limit switch 76 is shown just above the cocking solenoid. The push button assemblies including the trolley buses are shown in the left central portion. A loud speaker 214 receives the output of the audio amplifiers in the block 204 through line 216.

As previously indicated, the signal seeking tuner portion is controlled to index to the desired point when a signal is tuned in on the receiver. This is accomplished by developing a positive signal on line 218 which is connected directly to the grid 220 of the control tube 212. This tube 212 is a duo-triode tube having two triode sections. The first section controlled by grid 220 is normally nonconducting during the tuning action, but becomes conducting when a station is tuned in to index the tuner. The plate 222 of this first section of the tube is directly connected through line 224 to the control grid 226 of the second section of the tube. Plate 222 is also connected through resistor 225 to cathode 250. Thus the conductivity of the first section controls in inverse manner the conductivity of the second section; that is, when one triode conducts the other becomes non-conductive. The plate 228 of the second section is connected through lines 230 and 232 to one terminal of the relay coil 87. The opposite terminal of the relay coil 87 is connected to line 234 which extends to the amplifying section of the receiver and also to the output of the double rectifier tube 210 to provide power for the coil.

The relay 86 has a movable armature 88 consisting in part of two spaced portions 236 and 236' which are commonly grounded, section 236 alternately engaging stationary contacts 238 and 240 and section 236' similarly engaging contacts 242 and 244. Contact 238 is connected through line 246 to a resistor 248 and thence to the cathode 250 of the second section of the tube 212. A second resistor 252 is connected between cathode 250 and ground. Resistor 251 is connected between cathode 250 and line 234. Line 246 is likewise connected back through tie line 254 to the audio amplifier to provide a ground. Contact 240 is directly connected through line 256 to the control grid 220 of the first section of the tube. Contact 242 of the other portion of the relay switching means is connected through line 258 to limit switch 76, the movable arm of which cooperates with two fixed contacts 260 and 262. A second portion of the same limit switch, having a movable arm 76', engages two fixed contacts, one of which is unconnected and the other, 264, is connected through line 266 to stationary contact 244 of the relay 86. Stationary contact 262 is connected through line 268 to one terminal of the cocking solenoid coil 78, the opposite end of which is connected through line 270 to the main off and on switch 272 which is in turn supplied from the incoming power lead 273. Line 274 is connected to the main power supply through an inductance 276 and supplies current to the heaters of the various tubes. An indicating light 278 is also connected between the switch 272 and ground to advise the operator as to when the receiver is energized.

Line 232 is connected to a resistor 280, the opposite terminal of which is connected to stationary contact 152 engageable by one arm 150 of the initiating switch 148. Line 216 connects the output of the audio amplifier with the speaker 214. One portion 150 of the movable arm of the starting switch 148 is connected through line 298 to the audio amplifying section of the receiver in which it is grounded through resistors (not shown), and the other section 150' is connected to ground. This second section 150' engages a stationary contact 154 which is connected back through line 302 to the output of the audio amplifier.

The central control button 8 of the tuner is, as before indicated, different from the four favorite station buttons and is intended to control the normal signal seeking operation of the tuner. Insulated contact 132 connects stationary contacts 193 and 193' when the button is forced inwardly. One of the contacts 193' which engages the switching portion 132 of the slide is connected through line 304 to a movable switch arm 306 which moves over various taps 308 on a resistance to provide sensitivity control for the tuner. The last tap of the sensitivity control is connected to line 309 and thence through resistor 310 to line 312, extending to join line 266 at stationary contact 244. Line 309 is also connected to resistor 316, in turn connected to the cathode of the R. F. amplifier tube 202, and also through resistors 313 and 315 in series to line 317 connected to the cathodes of the I. F. amplifiers (not shown). Through this sensitivity control the strengh of the stations affecting indexing can be controlled so that the operator may so adjust the tuner that it will only stop on relatively strong local stations or so that it will pick up a very large number of stations, some of which may be relatively weak. The contact 193 is connected through line 195 to contact 260 of switch 76. The favorite station push buttons 4, 6, 10 and 12 are indicated by the same reference numerals as appeared in the mechaniacl portion of the description. The trolley buses 174, 176, 178 and 180 are shown just below the push button members. Adjustable tabs 20, 22, 24 and 26 are each indicated by a line having dual arrows extending in opposite directions to indicate that they may be moved along the wires. Arrow 182 indicates the sliding connection of tab 26 on trolley wire 174, and dot 186 at the lower end of the wire indicates the contact to be made as the contacting end 188 of the pointer sweeps across the dial. The other tab connections are similarly illustrated.

The device is adjusted and operated in the following manner. Assuming that the main switch 272 has been closed and power is applied to the necessary portions of the receiver and it is desired to operate the same for signal seeking tuning reception, the operator brings pressure on the push button 8, starting its movement inwardly. This inward movement brings cam face 164 in contact with the transverse bar 138, forcing it to one side to release any favorite station assembly that was locked in. It also causes operation of the triggering switch 148 which need be maintained in this inward position only momentarily and relay coil 86 is energized. It is then maintained energized through conductance of the second triode section of tube 212. This pulls its armature 236, 236' to the left as shown in Figure 6, closing with contacts 238 and 242, and at the same time removes the dentent 90 from engagement with the governor vanes 72, permitting the tuner to scan the band. The energizing circuit for the relay coil 86 is as follows: from the output of the full wave rectifier through line 234 to one terminal of the coil 86, through line 232, resistor 280, contact 152, arm 150, line 298 to ground through resistors in the receiver as mentioned.

After energization and opening of switch 150, 152 which is only momentarily closed, the relay coil 86 is maintained energized through the conductivity of the second section of the tube 212 inasmuch as the coil 86 is directly in the plate-cathode circuit thereof. This circuit may be traced as follows: power supply lead 234, coil 86, line 232, line 230, plate 228, cathode 250, resistance 252, to ground. At this time the first section of the tube is biased to cutoff by the low potential of the grid 220. As described in the co-pending application above referred to, the tuner will scan the band, causing the limit switch 76 to operate if one end of travel is reached and cocking solenoid 78 will be energized to reload the spring drive as in the previous instances. When a station having sufficient strength is received to apply a positive pulse to grid 220 to cause the first portion of the tube to conduct, the voltage on control grid 226 of the second section will decrease to such a point as to reduce the conductivity of this section so that relay coil 86 is insufficiently energized to hold its armature and it therefore drops out, mechanically stopping the gear train through the detent 90 engaging the governor vanes and causing other desired switching. If another station is desired, switch 8 is merely forced inwardly momentarily and the tuner goes through the same process. By moving arm 306 over the various taps 308 on the sensitivity control 311, the strengths of the incoming signals are so adjusted as to vary the response of the tuner to signals of different strengths. Thus by operating the push button 8 alone the system will continue to operate as a conventional signal seeking one stopping only on the receipt of incoming signals of a sufficient strength.

If now the operator desires to initially set up a plurality of so-called "favorite" stations to which the tuner will immediately go upon proper actuation, this is accomplished in the following manner. The desired station is tuned in by the operator using button 8. He then adjusts one of the sliding tabs so that its indicating pointer 190 is in alignment with the pointer of the receiver. Assuming that the setup is being made for push button 4 and that the station desired has a frequency of 600 kc., then adjustable tab 20 is moved to bring its indicating tip into the vicinity of 600 kc. on the dial and into alignment with the end of the indicating needle 18. At this point contact would normally be made between the contacting arm 186 and the conducting extension 188 of the indicating needle. This is all that is necessary to set up the station initially. Each of the other tabs 22, 24, and 26 may be adjusted to other stations along the band in exactly the same manner for setting up the stations receivable when push buttons 6, 10 and 12 are operated.

In general, the apparatus is so designed that when the favorite station section is placed in operation the scanning action of the signal seeking tuner continues, but the indexing action caused by the incoming stations is discontinued so that regardless of how many signals appear on the amplifying apparatus none will affect the indexing and that whole indexing portion of the system will be deenergized and inoperative until the tuner approaches a very narrow band in the proximity of the desired station. When the conductive extension 188 of the indicating needle makes contact with conductive tab 186 on any particular adjustable member whose associated button is depressed and latched, the indexing system is reenergized and when the signal of a station appears on the amplifier, it will act to index the set as before.

This action is accomplished as follows. As long as the signal seeking button 8 is depressed and held in by the small tooth 162, the switch 193, 132, 193' is closed. This completes the circuit to ground for the sensitivity control member 311 and the signal seeker can operate as desired. It is to be noted that the adjustable resistor 311, termed the sensitivity control, is a common cathode return circuit for both the R. F. amplifier 202, through resistor 316, and the I. F. amplifier (not shown separately in the amplifying and detecting means), through line 317 and resistors 315 and 313, and therefore determines the bias on the R. F. and I. F. cathodes. The sensitivity of the amplifier is so designed as to be of a different value during the listening period as against the scanning tuning period. The sensitivity during the listening period is determined by the value of the resistor 310 in combination with the resistors 316, 315 and 313 in their respective cathode circuits. The sensitivity during scanning is variable depending on the fixed resistors 316, 315 and 313 plus the percentage of resistance of 311 in the common return circuit. The switching from one sensitivity to another is accomplished by movable armature 236' which either grounds the circuits of resistances 316, 315 and 313 and common circuit resistor 310 on deenergized stationary contact 244 or the circuits of resistances 316, 315 and 313 and some portion of resistance 311 through stationary contact 242.

However, upon the inward travel of any one of the favorite station buttons 4, 6, 10 or 12, the switch 193, 132, 193' for the signal seeking tuning button 8 is opened, disconnecting the sensitivity control 311 from ground entirely so that the amplifier is inoperative during the scanning motion to provide a control pulse for stopping the same and a substitute or auxiliary circuit has to be provided. When neither one of these circuits is complete, the amplifier is inoperative, since the cathodes may float. The circuit for applying the desired stopping signal to the control is therefore incomplete for indexing and the scanning motor will continue to operate if necessary, operating the limit switching means until the conductive extension 188 on the indicating needle comes in contact with the conducting extension 186 on the adjustable tab 168 of the push button which has been operated and locked in. The conductive arm 188 will, of course, mechanically contact each of the conductive members 186 of all tabs as it scans the band, but it will not complete any circuit thereby since there is in series with each the additional switch 192, 132, 192' which is necessary to complete the grounding circuit.

For example, let it be assumed that the push button 4 has been forced inwardly and locked. The initial action, of course, releases the signal seeking button 8 and it returns to its outermost position. The inward locked position of the assembly 4 closes the switch 192, 132, 192' for this station. The contact 192 is in this case shown connected to the trolley bar 180 which is the bar or wire in sliding engagement with the adjustable tab 20 which can be moved anywhere along its length. As the conductive end of 188 rides over the conductive members 186 of the various tabs which are connected to the other trolley wires, no circuit will be completed and, therefore, the scanner will continue its operation. However, when it engages the conductive tab 186 of the tab 20, a circuit will be completed to place the signal seeking tuner index portion in condition for operation and that can immediately take over and index on the next station signal received. This newly completed circuit is an auxiliary grounding circuit for the cathodes and in this instance includes the resistors 316, 315 and 313 in their respective circuits and 310 in series to ground, the tuning sensitivity being the same as the listening sensitivity. This circuit is as follows: from the cathode of tube 202 through resistor 316 to common line 309, and from the I. F. tube cathode (not shown) through line 317, resistors 315 and 313, to common line 309, thence through a common circuit, resistor 310, line 312, line 266, contact 264, switch arm 76', line 314, contact 192', conductor 132 and contact 192 of slide assembly 4, trolley line 180, U-shaped conductor 172, extension 186 thereof on tab 20, and extension 188 of the indicating needle to ground. Thus, each time a circuit is completed including contact of the members 188 and 186 and, in series therewith, a switching means 192, 132, 192' of any one of the slide assemblies, this auxiliary grounding circuit is completed and the signal seeking tuner will then stop on the next signal. The same operation of course is applicable to any one of the other favorite station tuner slide assemblies except that in that case other trolley wires will be connected to the control line 314 by the operation of their associated switches and the tuning indexing means will be energized by contact with the conductive tongues 186 of one of the other adjustable tabs. In brief, the scanner will operate over the whole band but be able to energize the indexing means only for a very small area thereof in which the desired station is located and this area can be located by moving the adjustable tabs 20, 22, 24, and 26 to any position in the band.

It will thus be evident that I have provided a combination signal actuated or signal seeking tuner means and a favorite station or direct tuning means for any given predetermined station. By operating one of the buttons 4, 6, 10 or 12 the operator can immediately bring in a station preset thereon and only that station. The tuner will remain energized until that station is received. On the other hand, by operating the push button 8 the tuner will operate as a normal signal seeking station and pick up each station having sufficient strength in its signal to index the tuner as it scans the band. This makes a very satisfactory combination inasmuch as a plurality of stations which are normally received by the driver of the car in the vicinity of operation of the vehicle during most of the time can be received directly, but as soon as the car is taken beyond that location the tuner will then operate to bring in any station on the air without presetting.

I claim:

1. In radio receiving apparatus, amplifying and detecting means in which signals are developed by the reception of carrier waves, movable tuning means for tuning the receiver over a band of frequencies, indicating means connected to the tuning means to move therewith and indicate the position thereof, means for driving the tuning and indicating means, indexing means to stop the driving means, electron tube means connected to and controlling the indexing means, conductive means connected to the detecting means on which the signal appears and to the electron tube to control the same and cause actuation of the index means when a carrier is received, a plurality of trolley wires mounted substantially parallel to the path of travel of the indicator, a plurality of adjustable contactors mounted adjacent said wires, each engaging one of said wires and movable along the length thereof, said contactors being engageable by the indicating means as it moves along its path to form switching means therewith, and conductive means connecting the wires, contactors and indicating means in circuit with the amplifying means to control the energization thereof.

2. In radio receiving apparatus having amplifying and detecting means, means for tuning the apparatus over a predetermined band of frequencies, driving means for the tuning means, cathode biasing means for the amplifying means to determine the sensitivity of the receiver, a plurality of manually operated switches connected in parallel to the biasing means, and a plurality of switches, each connected in series with one of the manually operated switches adjustably mounted along the path of movement of the tuning means and engageable by a portion thereof to control the biasing circuit and the receiver.

3. In radio receiving apparatus having amplifying and detecting means, tuning means for tuning the receiver over a portion of the frequency spectrum, driving means for the tuning means, indexing means for stopping the tuning means, control means for the indexing means operated by the appearance of a carrier signal in the receiver, cathode biasing means for the amplifying means, a plurality of parallel switching circuits connected to the biasing means, a manually operable selector switch in each parallel switching circuit, and a series switching means in each parallel circuit adjustable along the path of the tuning means and actuated thereby to control the bias means for the amplifier.

4. In radio receiving apparatus, a casing, movable means for tuning said apparatus over a predetermined frequency band mounted on said casing, indicating means connected to said tuning means which follows a definite path as the tuning means moves over the band, said indicating means being electrically grounded, an electrical insulating member mounted on said casing along the path of movement of the indicating means, a plurality of separate conductors carried by the insulating means, and a plurality of contact means mounted to have sliding engagement with said conductors and adjustable along the same located in the path of and engageable by the indicating means to complete electrical circuits.

5. In radio receiving apparatus, a casing, movable means for tuning said apparatus over a predetermined frequency band mounted on said casing, indicating means connected to said tuning means which follows a definite path as the tuning means moves over the band, said indicating means being electrically grounded, an electrical insulating member mounted on said casing along the path of movement of the indicating means, a plurality of separate conductors carried by the insulating means, a plurality of contact means mounted to have sliding engagement with said conductors and adjustable along the same located in the path of and engageable by the indicating means to complete electrical circuits, and separate manually operable switching means connected to each conductor and to the apparatus to individually connect one conductor at a time to said apparatus.

6. In radio receiving apparatus, amplifying and detecting means in which signals are developed by the reception of carrier waves, movable tuning means for tuning the receiver over a band of frequencies, indicating means connected to the tuning means to move therewith and indicate the position thereof, means for driving the tuning and indicating means, indexing means to stop the driving means, electron tube means connected to and controlling the indexing means, conductive means connected to the detecting means on which the signal appears and to the electron tube to control the same and cause actuation of the index means when a carrier is received, an electrical insulating member mounted along the path of the indicating means, a plurality of separate conductors carried on said insulating member, a plurality of slidable contact means mounted to engage the conductors and adjustable along the lengths thereof and lying in the path of the indicating means to contact the same as it passes, switch means connected in series with each conductor and commonly to said amplifying and detecting means to form parallel control paths and a plurality of reciprocating push button means to actuate the last-named switching means.

7. In radio receiving apparatus, amplifying and detecting means in which signals are developed by the reception of carrier waves, movable tuning means for tuning the apparatus over a band of frequencies, means for driving the tuning means, indexing means to stop the driving means, electron tube means connected to and controlling the indexing means, conductive means on which a signal appears connected to the detecting means and to the electron tube to control the tube and cause actuation of the indexing means when a carrier is received, a part connected to and movable with said tuning means over a certain path, an insulating member mounted adjacent said path, a plurality of parallel conductors mounted on said member, a plurality of contactors adjustably mounted along said path and each engaging one of said conductors at any position along its length, said contactors being engageable by the part movable with the tuning means at their adjusted locations as the part moves along its path, and conductive means connecting the conductors and contactors and means movable with the tuning means in a plurality of parallel circuits with the amplifying means to control the energization thereof.

8. In radio receiving apparatus, amplifying and detecting means in which signals are developed by the reception of carrier waves, movable tuning means for tuning the apparatus over a band of frequencies, means for driving the tuning means, indexing means to stop the driving means, electron tube means connected to and controlling the indexing means, conductive means on which a signal appears connected to the detecting means and to the electron tube to control the tube and cause actuation of the indexing means when a carrier is received, a part connected to and movable with said tuning means over a certain path, an insulating member mounted adjacent said path, a plurality of parallel conductors mounted on said member, a plurality of contactors adjustably mounted along said path and each engaging one of said conductors at any position along its length, said contactors being engageable by the part movable with the tuning means at their adjusted locations as the part moves along its path, conductive means connecting the conductors and contactors and means movable with the tuning means in a plurality of parallel circuits with the amplifying means to control the energization thereof, and manually operable switches connected in series relation in each parallel circuit to control which shall actuate the indexing means.

9. In radio receiving apparatus having amplifying and detecting means, movable means for tuning the apparatus over a predetermined band of frequencies, driving means connected to said tuning means, resistor biasing means connected to the amplifying means to determine the sensitivity of the receiving apparatus, a plurality of manually operable switches connected in separate circuits to the resistor biasing means, a plurality of switching means each connected in circuit with one of the manually operable switches, said last-named switches including a plurality of conductive means adjustably mounted along a path of movement of the tuning means and engageable by a portion thereof at defined positions to complete the biasing circuit, and means extending from the adjustably mounted conductive means and accessible to an operator so that the adjustable means may be manually moved to a known position of tuning for the reception of a desired station.

10. In radio receiving apparatus having amplifying and detecting means, movable means for tuning the apparatus over a predetermined band of frequencies, driving means connected to the movable means, resistor biasing means connected to the amplifying means to determine the sensitivity of the same, a plurality of switch contact means connected individually to the resistor biasing means and adjustably mounted along a path of the tuning means, a part connected to the movable tuning means and engageable with the various switch contact means as the movable tuning means proceeds over the band to form switching control means therewith, and visible means connected to each switch contact means and extending into juxtaposition with the part connected to the movable tuning means so that the operator may set the adjustable switch contact at a desired point in the frequency spectrum to which the apparatus is tunable.

11. In radio receiving apparatus having amplifying and detecting means, movable means for tuning the apparatus over a predetermined band of frequencies, driving means connected to the movable means, indicating means connected to the movable means to indicate the position of the tuning means, resistor biasing means connected to the amplifying means to determine the sensitivity of the same, a plurality of switch contact means connected to the resistor biasing means to control the same and adjustably mounted along a path of the tuning means, a part connected to the movable tuning means and engageable with the various switch contact means as the movable tuning means proceeds over the band to form switching control means, and manually engageable and visible means connected to each adjustable switch contact accessible to the operator and in juxtaposition to the indicating means so that the operator may move a contact to a given frequency in the band to provide automatic indexing of the movable tuning means.

References Cited in the file of this patent

UNITED STATES PATENTS

| | | |
|---|---|---|
| 2,330,833 | Marholz | Oct. 5, 1943 |
| 2,499,967 | Nicholson | Mar. 7, 1950 |
| 2,501,003 | Pifer | Mar. 21, 1950 |